United States Patent
Itagaki et al.

(10) Patent No.: US 6,703,262 B2
(45) Date of Patent: *Mar. 9, 2004

(54) METHOD FOR PLANARIZING CIRCUIT BOARD AND METHOD FOR MANUFACTURING SEMICONDUCTOR DEVICE

(75) Inventors: Minehiro Itagaki, Moriguchi (JP); Yoshihiro Tomuro, Hirakata (JP); Satoru Yuhaku, Osaka (JP); Kazuyoshi Amami, Hirakata (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 170 days.

(21) Appl. No.: 09/195,514

(22) Filed: Nov. 19, 1998

(65) Prior Publication Data

US 2001/0029066 A1 Oct. 11, 2001

(30) Foreign Application Priority Data

Nov. 19, 1997 (JP) .............................. 9-318630

(51) Int. Cl.[7] .............................................. H01L 21/44
(52) U.S. Cl. .................... 438/124; 438/125; 438/127
(58) Field of Search .................. 438/124, 125, 438/126, 127; 257/691, 692, 693, 694, 666, 667, 668; 357/68, 67, 72, 73, 79, 80; 757/72, 67

(56) References Cited

U.S. PATENT DOCUMENTS

| | | | | |
|---|---|---|---|---|
| 4,300,153 A | | 11/1981 | Hayakawa et al. | |
| 4,420,364 A | * | 12/1983 | Nukii et al. | 174/257 |
| 4,544,989 A | * | 10/1985 | Nakabu et al. | 257/713 |
| 4,991,285 A | * | 2/1991 | Shaheen et al. | 29/830 |
| 5,001,542 A | * | 3/1991 | Tsukagoshi et al. | 357/68 |
| 5,068,712 A | * | 11/1991 | Murakami et al. | 357/72 |
| 5,120,665 A | | 6/1992 | Tsukagoshi et al. | 437/8 |
| 5,150,193 A | * | 9/1992 | Yashuhara et al. | 357/70 |
| 5,358,904 A | * | 10/1994 | Murakami et al. | 437/209 |
| 5,426,849 A | * | 6/1995 | Kimbara et al. | 29/830 |
| 5,450,287 A | | 9/1995 | Ujiie | |
| 5,534,464 A | | 7/1996 | Ujiie | |
| 5,688,408 A | * | 11/1997 | Tsuru et al. | 216/17 |
| 5,831,441 A | * | 11/1998 | Motooka et al. | 324/754 |
| 5,863,817 A | * | 1/1999 | Murakami et al. | 438/124 |
| 5,914,530 A | * | 6/1999 | Murakami et al. | 257/666 |
| 5,981,315 A | * | 11/1999 | Murakami et al. | 438/127 |
| 6,018,191 A | * | 1/2000 | Murakami et al. | 257/691 |

FOREIGN PATENT DOCUMENTS

| | | | | |
|---|---|---|---|---|
| FR | 2763751 | * | 11/1998 | 13/4 |
| GB | 2142477 | * | 1/1985 | 9/9 |
| JP | 07162170 | * | 6/1995 | 7/14 |
| JP | 07202115 A | | 8/1995 | |

* cited by examiner

Primary Examiner—Carl Whitehead, Jr.
Assistant Examiner—Laura Schillinger
(74) Attorney, Agent, or Firm—RatnerPrestia

(57) ABSTRACT

A method for planarizing a circuit board, has a step of fixing a circuit board having wiring layers on both sides to a board having a flat surface through an adhesive layer, wherein said circuit board is pressed from above by a flat member on fixing thereof.

15 Claims, 3 Drawing Sheets

METHOD FOR PLANARIZING CIRCUIT BOARD AND METHOD FOR MANUFACTURING SEMICONDUCTOR DEVICE

BACKGROUND OF THE INVENTION

1. Field of the Invention

The present invention relates to a method for planarizing a circuit board, and a method for manufacturing a semiconductor device.

2. Description of the Related Art

Semiconductor devices contribute to the reduction in size of information communication equipment, official electronic equipment, household electronic equipment, industrial electronic equipment such as measuring apparatuses and assembling robots, medical electronic equipment, and electronic toys, and facilitates the miniaturization thereof.

The manufacturing of semiconductor devices requires semiconductor elements and wiring boards for mounting them thereon. As technology for mounting a semiconductor element on a wiring board, a wire bonding method has been the mainstream conventionally. However, a flip-chip method capable of reducing the mounting area of semiconductor elements has become the mainstream in recent years. In a wiring board on which a semiconductor element is to be mounted, in mounting a semiconductor element by a wire bonding method, the electrodes on the semiconductor element are bonded outward to the electrodes of the wiring board placed outside the semiconductor element by wire, respectively, and hence the electrodes on the wiring board may be placed with a larger pitch than the pitch of electrodes of the semiconductor element. Contrarily, in mounting a semiconductor element with a flip-chip method, the electrodes of the semiconductor element must be located corresponding to the electrodes of the wiring board in a one-to-one relationship. Therefore, as wiring board for mounting a semiconductor element thereon with a flip-chip method, a high-density board, i.e., a board on which a fine line is to be formed is desirable. Further, a reduction in size of a semiconductor device requires a board to which a wiring layer is connected through an inner via.

It is a ceramic multi-layer printed circuit board to satisfy the foregoing demands. However, a ceramic plate board generally has a limitation on its cost reduction as compared with resin boards such as glass epoxy boards, which actually restricts the introduction into consumer-electronics products.

A resin plate board has a higher possibility that a larger cost reduction can be achieved due to its manufacturing method than in the case of a ceramic plate board. However, the resin board has a lower rigidity than that of a ceramic plate board, and hence there occur nonuniform wiring density, and deformation when the board decreases in thickness, resulting in a difficulty in flip-chip mounting of a semiconductor element.

SUMMARY OF THE INVENTION

In view of the foregoing, it is therefore an object of the present invention to provide a method for manufacturing a semiconductor device with stability.

A method for planarizing a circuit board according to the present invention, comprises: a step of fixing a circuit board having wiring layers on both sides to a board having a flat surface through an adhesive layer, wherein the circuit board is pressed from above by a flat member on fixing thereof.

A method for manufacturing a semiconductor device according to the present invention, comprises: a step of fixing a circuit board having wiring layers on both sides to a board having a flat surface through an adhesive layer; a step of mounting a semiconductor element so that a plurality of electrodes on the semiconductor element are face-down bonded to the exposed wiring of the fixed circuit board in a one-to-one relationship; a step of filling the clearance between the circuit board and the semiconductor element with an insulating resin paste; a step of curing the insulating resin paste; and a step of peeling off the circuit board on which the semiconductor element is mounted from the interface with the adhesive layer on the board having a flat surface, wherein the circuit board is pressed from above by a flat member on fixing the circuit board.

A method for manufacturing a semiconductor device according to the present invention, comprises: a step of fixing a circuit board having wiring layers on both sides to a motherboard having a flat surface through an adhesive layer; a step of mounting a semiconductor element so that a plurality of electrodes on the semiconductor element are face-down bonded to the exposed wiring of the fixed circuit board in a one-to-one relationship; a step of filling the clearance between the circuit board and the semiconductor device with an insulating resin paste; and a step of curing the insulating resin paste, wherein the circuit board is pressed from above by a flat member on fixing the circuit board.

DESCRIPTION OF NUMERALS

Figure 1:
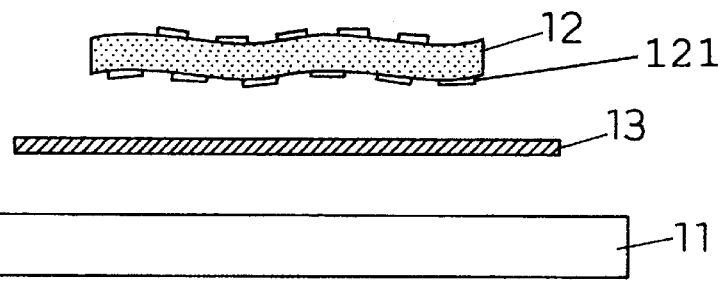
FIG. 1 is a schematic cross sectional view of a semiconductor device in a first step of the manufacturing process according to a first embodiment of the present invention.
Figure 2:
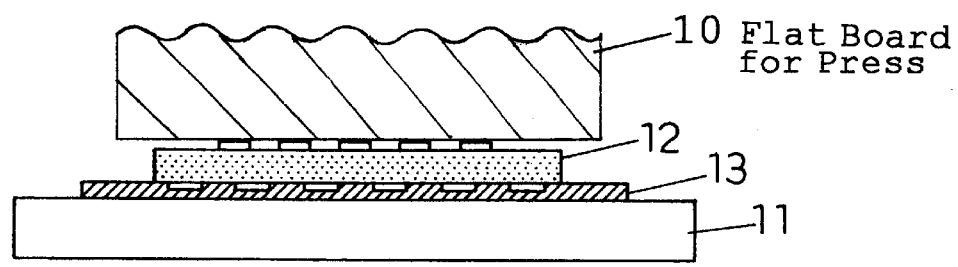
FIG. 2 is a schematic cross sectional view of the semiconductor device in a second step of the manufacturing process according to the first embodiment of the present invention.
Figure 3:
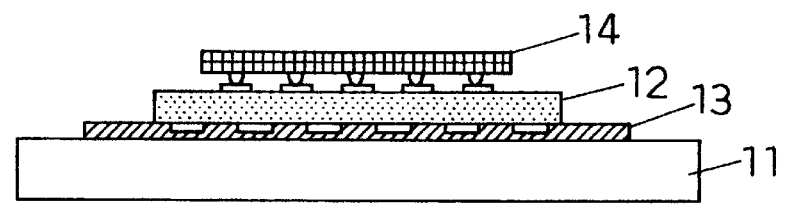
FIG. 3 is a schematic cross sectional view of the semiconductor device in a third step of the manufacturing process according to the first embodiment of the present invention.
Figure 4:
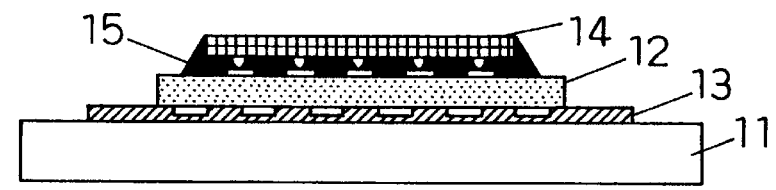
FIG. 4 is a schematic cross sectional view of the semiconductor device in a fourth step of the manufacturing process according to the first embodiment of the present invention.
Figure 5:
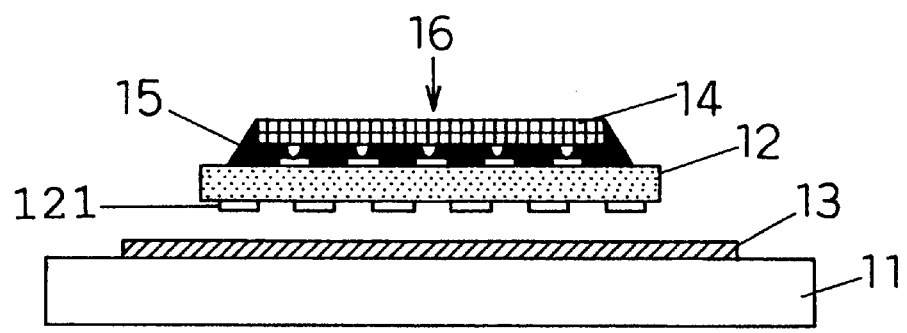
FIG. 5 is a schematic cross sectional view of the semiconductor device in a fifth step of the manufacturing process according to the first embodiment of the present invention.

| | |
|---|---|
| 11, 21, 31 | glass plate (flat board) |
| 41 | sintered alumina board having openings |

-continued

| | |
|---|---|
| 12, 22, 32, 42 | circuit board |
| 13, 33 | adhesive sheet |
| 23, 43 | adhesive layer |
| 14, 24, 34, 44 | semiconductor element |
| 15, 25, 35, 45 | insulating resin (paste) |
| 16, 27 | semiconductor device |
| 26 | filler with a high coefficient of thermal expansion |
| 46 | opening |
| 121 | wiring layer. |

DETAILED DESCRIPTION OF THE INVENTION

Below, the present invention will now be described by way of embodiments with reference to the drawings.

(Embodiment 1)

FIGS. 1 to 5 show a schematic cross section of a semiconductor device each in different steps of the manufacturing process according to a first embodiment in the order presented.

A first step: a circuit board 12 having wiring layers 12 on both sides is so constructed that the wiring layers 121 on both sides are electrically connected through inner via, and the board material is mainly composed of epoxy resin wherein an aramid fiber is dispersed in the epoxy resin. It is noted that glass fiber may be used in place of the aramid fiber. The circuit board 12 has a size of 12 mm×12 mm×0.4 mm, and the flatness in the area of 12 mm×12 mm is approximately 30 microns. Then, a glass plate 11 with a flatness of 5 microns or less is prepared. The glass plate 11 has a size of 40 mm×40 mm×1.5 mm. An adhesive sheet 13 (B-EL10 manufactured by Nitto Shinko) mainly composed of epoxy resin in the semi-cured state is stacked between the circuit board 12 and the glass plate 11. The adhesive sheet 13 has a size of 13 mm×13 mm×0.04 mm. Heating to approximately 50° C. on stacking results in better workability.

A second step: the laminated circuit board 12, adhesive sheet 13, and glass plate 11 are applied with heat while being applied with pressure so that the circuit board 12 may become flattened to cure the adhesive sheet 13 in the semi-cured state. The conditions of this process are 150° C. and 20 g/cm². It is noted that depressurization on curing the adhesive sheet 13 enables the bonding between the circuit board 12 and the glass plate 11 without mixing of bubbles therein. The circuit board 12 is well bonded to the glass plate 11 after curing of the adhesive sheet 13, and the flatness of the circuit board 12 is found to be 10 microns or less. Also, the circuit board 12 is pressed from above with a board for press, which ensures the planarization.

A third step: a semiconductor element 14 is face-down mounted on the planarized circuit board 12. The following mounting method is adopted. That is, a gold bump is formed on the electrode of the semiconductor element 14, and the end of the gold bump is applied with a conductive adhesive, and the gold bump and the wiring electrode on the circuit board 12 are bonded to each other by the conductive adhesive. The conductive adhesive is a totally in-house manufactured product containing silver as conductive material, and the curing temperature is taken as 120° C.

A fourth step: an insulating resin paste 15 is filled in the clearance between the semiconductor element 14 and the circuit board 12, after which the insulating resin paste 15 is cured by a heat-treatment. The insulating resin paste 15 is a totally in-house manufactured product containing epoxy resin as main component, and containing silicon dioxide as filler, and the curing temperature is taken as 150° C. This results in a semiconductor device 16 bonded to the glass plate 11 through the adhesive sheet 13. After being cured, this insulating resin paste 15 exerts a function of preventing the semiconductor device from bending.

A fifth step: in order to take off the semiconductor device 16 from the glass plate 11, the cured adhesive sheet 13 is heated to approximately 100° C. The cured adhesive sheet 13 has a glass-transition temperature of approximately 70° C., and hence at a temperature of 70° C. or more, the structure of the adhesive sheet 13 is softened, which facilitates the removal of the semiconductor device 16.

In this embodiment, a glass plate is used, however, a sintered alumina board or SUS board may be also used as long as it has a good flatness. Further, as board having a flatness, a motherboard can be also utilized. In such a case, it is not necessary to take off the circuit board 12 and the semiconductor element 14 from the board in the final step, which affords a convenience that it can be used as it is. In that process, it is desirable to use an anisotropic conductive adhesive as material for the adhesive layer.

Also, as comparative example, the same experiment is carried out, except that an adhesive sheet and a thermoplastic adhesive sheet having a lower adhesion force than that of the adhesive sheet used in the above embodiment are used. The results are shown in Table 1.

TABLE 1

| Materials for adhesive sheet | Adhesion force (per area of 5 mm φ) | Mountability |
|---|---|---|
| B-EL10 manufactured by Nitto Shinko (Embodiment 1) | 2 kgf | OK |
| Revaalpha No. 3195H manufactured by Nitto Denko | 0.5 kgf | NG |
| Double-faced tape for stationery manufactured by Nitto Denko | 1 kgf | NG |

Each adhesive sheet is measured for its adhesion force in the following manner. That is, the underside of a cylindrical component having a diameter of 5 mm, and made of stainless steel is fixed with the adhesive sheet. Then, the force exerted when the component made of stainless steel is vertically pulled to be peeled off from the adhesive sheet is measured. The mountability is judged by if the connection between the semiconductor element and the circuit board is achieved in the mounting method of the semiconductor element described in the embodiment 1.

Figure 7:
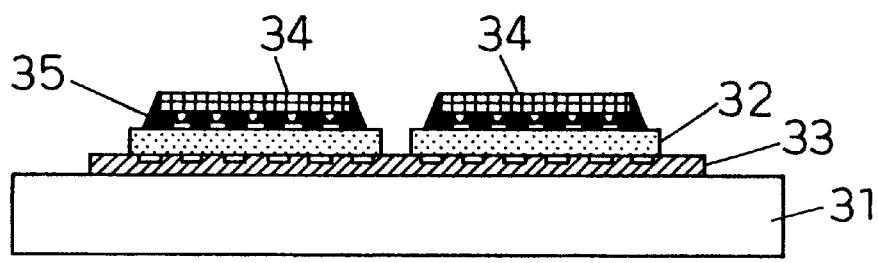
FIG. 7 is a schematic cross sectional view of semiconductor devices in one step when a plurality of the semiconductor devices are manufactured on one flat board.

Also, in this embodiment, only one circuit board with a size of 12 mm×12 mm is bonded onto the glass plate with a size of 50 mm×50 mm. However, it is needless to say that, even if a plurality of the circuit boards are bonded as shown in FIG. 7, the same results can be obtained.

Further, in this embodiment, the wiring formed on both sides of the circuit board is electrically connected through an inner via. However, it is needless to say that, a so-called, multi-layer printed circuit board, in which connection is achieved through inner layers, can provide the same results.

(Embodiment 2)

In an embodiment 2, an adhesive paste is used without using an adhesive sheet. The adhesive paste is a 3016 manufactured by Locktite, and a solvent-less type thermosetting insulating resin paste mainly composed of epoxy resin.

First, the adhesive paste is applied on the area of 13 mm×13 mm on a glass plate by screen printing. At this step, the film thickness is approximately 50 microns. In this state, a heat-treatment is conducted at a temperature of approximately 50° C. to render the adhesive paste in the semi-cured state, thereby laminating a circuit board. Then, a semiconductor device is manufactured in the same process as in the embodiment 1 to obtain the same results as in the embodiment 1.

Also, it is confirmed that when the circuit board and the glass plate are laminated without rendering the adhesive paste in the semi-cured state, the same results are obtained.

(Embodiment 3)

Figure 6:
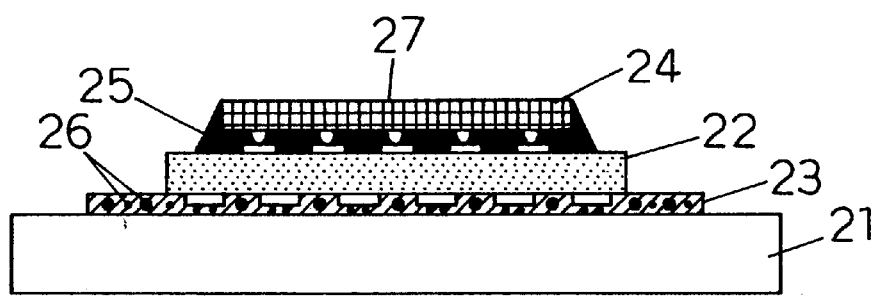
FIG. 6 is a schematic cross sectional view of a semiconductor device in one manufacturing process according to a third embodiment of the present invention.

The manufacturing method of a semiconductor device according to a third embodiment of the present invention will now be described based on FIG. 6. FIG. 6 shows a schematic cross section of the semiconductor device in one manufacturing process of the third embodiment.

A circuit board 22 is bonded to a flat glass plate 21 through an adhesive layer 23, resulting in good flatness of the circuit board 22. A semiconductor element 24 is mounted on the circuit board 22, and an insulating resin is filled in the clearance between the semiconductor element 24 and the circuit board 22.

The difference from the embodiment 1 is in the material constituents of the adhesive layer. That is, a filler 26 having a larger coefficient of thermal expansion than that of the material for the adhesive layer is contained in the adhesive layer of this embodiment. The adhesive layer used is a totally in-house manufactured product, and the material constituents thereof are approximately 70 ppm/° C. epoxy resin and approximately 150 ppm/° C. glass bead as filler 26.

The use of the adhesive layer 23 having such material constituents causes the filler 26 having a high coefficient of thermal expansion in the adhesive layer 23 to expand in the heat-treatment conducted when a semiconductor device 27 is removed from the glass plate 21. This facilitates the removal of the semiconductor device 27.

(Embodiment 4)

Figure 8:
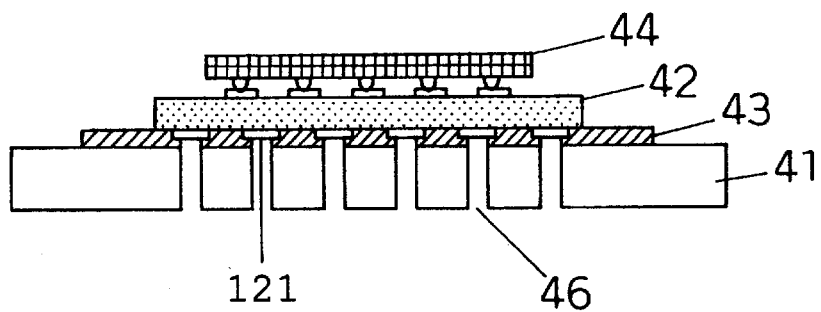
FIGS. 8(a) and 8(b) are schematic cross sectional views of a semiconductor device in different stages of the manufacturing process according to a fourth embodiment of the present invention.
Figure 8:
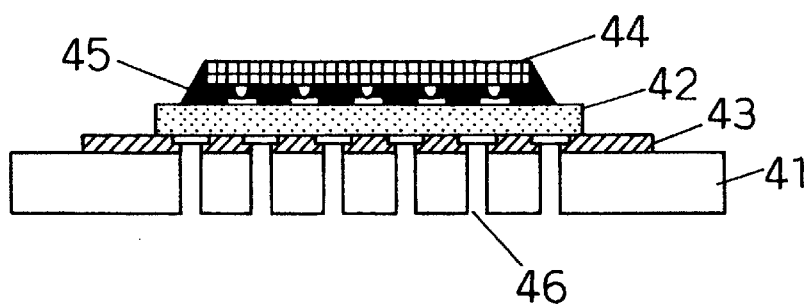

The manufacturing method of a semiconductor device according to a fourth embodiment of the present invention will now be described based on FIG. 8. FIG. 8 shows a schematic cross section of the semiconductor device in the manufacturing process of the fourth embodiment.

A circuit board 42 is flat, and it is bonded to a sintered alumina board 41 provided with openings 46 so as to each correspond to its respective electrode of the circuit board 42 through an adhesive layer 43, resulting in a good flatness. A semiconductor element 44 is mounted on the circuit board 42 having a good flatness. The sintered alumina board 41 has openings 46, and hence the inspection of electrical connection between the semiconductor element 44 and the wiring layer 121 of the circuit board 42 can be conducted in this state.

As a result of the inspection, when a poor connection is found, the semiconductor element 44 and the circuit board 42 have not been bonded to each other yet. Accordingly, the semiconductor element 44 or the circuit board 44 can be replaced with ease to repeat the process until connection can be obtained. With only the one in which connection has been achieved in this manner, an insulating resin 45 is filled in the clearance between the semiconductor element 44 and the circuit board 42 to effect bonding thereof.

As described above, the manufacturing method of the semiconductor device of the present invention provides an effect that, with even a resin board having a bad flatness, a flip-chip mounting of a semiconductor element can be implemented with stability.

The manufacturing method of the semiconductor device of the present invention provides an effect that, when the adhesion force of the adhesive layer is 1.5 kgf/5 mmΦ or more, even with a resin board having a large warp, planarization can be achieved to implement a flip-chip mounting of a semiconductor element with stability.

The manufacturing method of the semiconductor device of the present invention provides an effect that, when a filler is contained in the insulating resin of the adhesive layer, and the coefficient of thermal expansion of the filler is larger than that of the insulating resin, the removal of the semiconductor device from the flat board can be conducted by a heat-treatment with ease.

The manufacturing method of the semiconductor device of the present invention provides an effect that, when an opening is provided at a desired point of the flat board, the inspection of connection between the semiconductor element and the circuit board can be carried out, and hence defective products will not be manufactured.

What is claimed is:

1. A method of manufacturing a semiconductor device, comprising: a step of providing a flat board having a surface of predetermined flatness and free-of semiconductor devices;
   a step of forming an adhesive layer directly on top of the surface of the flat board;
   a step of fixing a prefabricated circuit board, having an insulating layer with wiring layers on both sides, to the flat board through the adhesive layer and planarizing said circuit board by the pressing said circuit board from above with a flat member; a step of mounting a semiconductor element so that a plurality of electrodes on said semiconductor element are face-down bonded to the exposed wiring of said prefabricated and planarized circuit board; and a step of peeling off said circuit board on which said semiconductor element is mounted from the interface with said adhesive layer on said flat board.

2. A method for manufacturing a semiconductor device according to claim 1, wherein the adhesion force of said adhesive layer is 1.5 kgf/5 mmΦ or more.

3. A method for manufacturing a semiconductor device according to claim 1, wherein said adhesive layer is, first, a thermosetting paste, and then, bonds said circuit board and said flat board by a heat-treatment.

4. A method for manufacturing a semiconductor device according to claim 1, wherein said adhesive layer is, first, a thermosetting resin film in the semi-cured state, and then, bonds said circuit board and said flat board by a heat-treatment.

5. A method for manufacturing a semiconductor device according to claim 1, wherein said adhesive layer has a structure in which a filler is contained in the material of said adhesive layer, and the coefficient of thermal expansion of said filler is larger than the coefficient of thermal expansion of the material for said adhesive layer.

6. A method for manufacturing a semiconductor device according to claim 1, wherein a plurality of said circuit boards are fixed to said single flat board through said adhesive layer, and said semiconductor elements are mounted on a plurality of said circuit boards, respectively.

7. A method for manufacturing a semiconductor device according to claim 1, wherein in said step of fixing said circuit board to a board having a flat surface through said adhesive layer, said adhesive layer is heated to 150° C. to effect curing and bonding thereof, while in said step of peeling off said circuit board on which said semiconductor element is mounted from the interface with said adhesive layer on said board having a flat surface, said adhesive layer is heated to 100° C. to be softened.

8. A method for manufacturing a semiconductor device according to claim 1, wherein said flat board is provided with an opening at a position corresponding to the position of said electrode of said circuit board, and after mounting said semiconductor element, and before filling said insulating resin paste, said opening is used to carry out an inspection of connection between said semiconductor element and said circuit board.

9. A method of manufacturing a semiconductor device comprising:

a step of fixing a prefabricated circuit board, having an insulating layer with wiring layers on both sides, to a motherboard through an adhesive layer and planarizing said circuit board by pressing said circuit board from above with a flat member; a step of mounting a semiconductor element so that a plurality of electrodes on said semiconductor element are face-down bonded to the exposed wiring of said prefabricated and planarized circuit board;

wherein said mother board is provided with an opening at a position corresponding to the position of said electrode of said circuit board, and after mounting said semiconductor element, and before filling said insulating resin paste, said opening is used to carry out an inspection of connection between said semiconductor element and said circuit board.

10. A method for manufacturing a semiconductor device according to claim 1, wherein said circuit board is a multilayer printed circuit board.

11. A method of planarizing a prefabricated circuit board having an insulating layer with wiring layers on both sides, comprising the steps of:

(a) providing a flat board having a surface of predetermined flatness and free-of semiconductor devices;

(b) forming an adhesive layer directly on top of the surface of the flat board;

(c) placing the prefabricated circuit board, having an insulating layer with wiring layers on both sides, on top of the adhesive layer;

(d) after step (c), pressing the prefabricted circuit board toward the flat board so that the circuit board is planarized; and (e) peeling the prefabricated and planarized circuit board away from the adhesive layer.

12. The method of claim 11 in which the circuit board is non-defective and includes the step of using for its intended purpose the circuit board free-of the flat board.

13. The method of claim 11 in which the circuit board is pressed by an additional flat board.

14. The method of claim 1 including the steps of:

a step of filling the clearance between the circuit board and the semiconductor device with an insulating resin paste; and a step of curing the insulating resin paste.

15. The method of claim 9 including the steps of:

a step of filling the clearance between the circuit board and the semiconductor device with an insulating resin paste; and a step of curing the insulating resin paste.

* * * * *

UNITED STATES PATENT AND TRADEMARK OFFICE
CERTIFICATE OF CORRECTION

PATENT NO. : 6,703,262 B2
DATED : March 9, 2004
INVENTOR(S) : Minehiro Itagaki et al.

It is certified that error appears in the above-identified patent and that said Letters Patent is hereby corrected as shown below:

<u>Title page,</u>
Item [75], Inventor, "Tomuro" should read -- Tomura --.
Item [56], References Cited, U.S. PATENT DOCUMENTS, "Yashuhara" should read -- Yasuhara --.

Signed and Sealed this

Fourteenth Day of September, 2004

JON W. DUDAS
*Director of the United States Patent and Trademark Office*